United States Patent [19]
Matano

[11] Patent Number: 5,949,734
[45] Date of Patent: Sep. 7, 1999

[54] SEMICONDUCTOR MEMORY DEVICE

[75] Inventor: Tatsuya Matano, Tokyo, Japan

[73] Assignee: NEC Corporation, Tokyo, Japan

[21] Appl. No.: 09/103,724

[22] Filed: Jun. 24, 1998

[30] Foreign Application Priority Data

Jun. 26, 1997 [JP] Japan ..................................... 9-170569

[51] Int. Cl.$^6$ .............................. G11C 8/00; G11C 16/04
[52] U.S. Cl. .................... 365/230.03; 365/236; 365/240; 365/189.01
[58] Field of Search .............................. 365/230.03, 236, 365/240, 189.01

[56] References Cited

U.S. PATENT DOCUMENTS

| | | | |
|---|---|---|---|
| 4,802,125 | 1/1989 | Yamada | 365/230.03 |
| 5,233,701 | 8/1993 | Nakata | 365/230.03 |
| 5,691,949 | 11/1997 | Hively et al. | 365/230.03 |

*Primary Examiner*—Trong Phan
*Attorney, Agent, or Firm*—Sughrue, Mion, Zinn, Macpeak & Seas, PLLC

[57] ABSTRACT

A semiconductor memory device which has a plurality of main word lines, a plurality of sub-word lines connected to the main word lines, and memory blocks connected to the sub-word lines, and can read/write memory information in one memory block by supplying a block selection signal to one memory block includes an initial address memory means, a block count memory means, a read/write completion detecting means, a block selecting means, and a data transfer completion means. The initial address memory means stores the initial address of a read/write memory block. The block count memory means stores the number of read/write memory blocks. The read/write completion detecting means detects completion of a read/write for one memory block. The block selecting means outputs a block selection signal to activate one memory block on the basis of an initial address, and outputs a block selection signal to activate the next memory block on the basis of a read/write completion detection signal from the read/write completion detecting means. The data transfer completion means counts the number of read/write completion memory blocks on the basis of the read/write completion detection signal, and when the count value reaches the number of memory blocks in the block count memory means, completes a read/write.

10 Claims, 11 Drawing Sheets

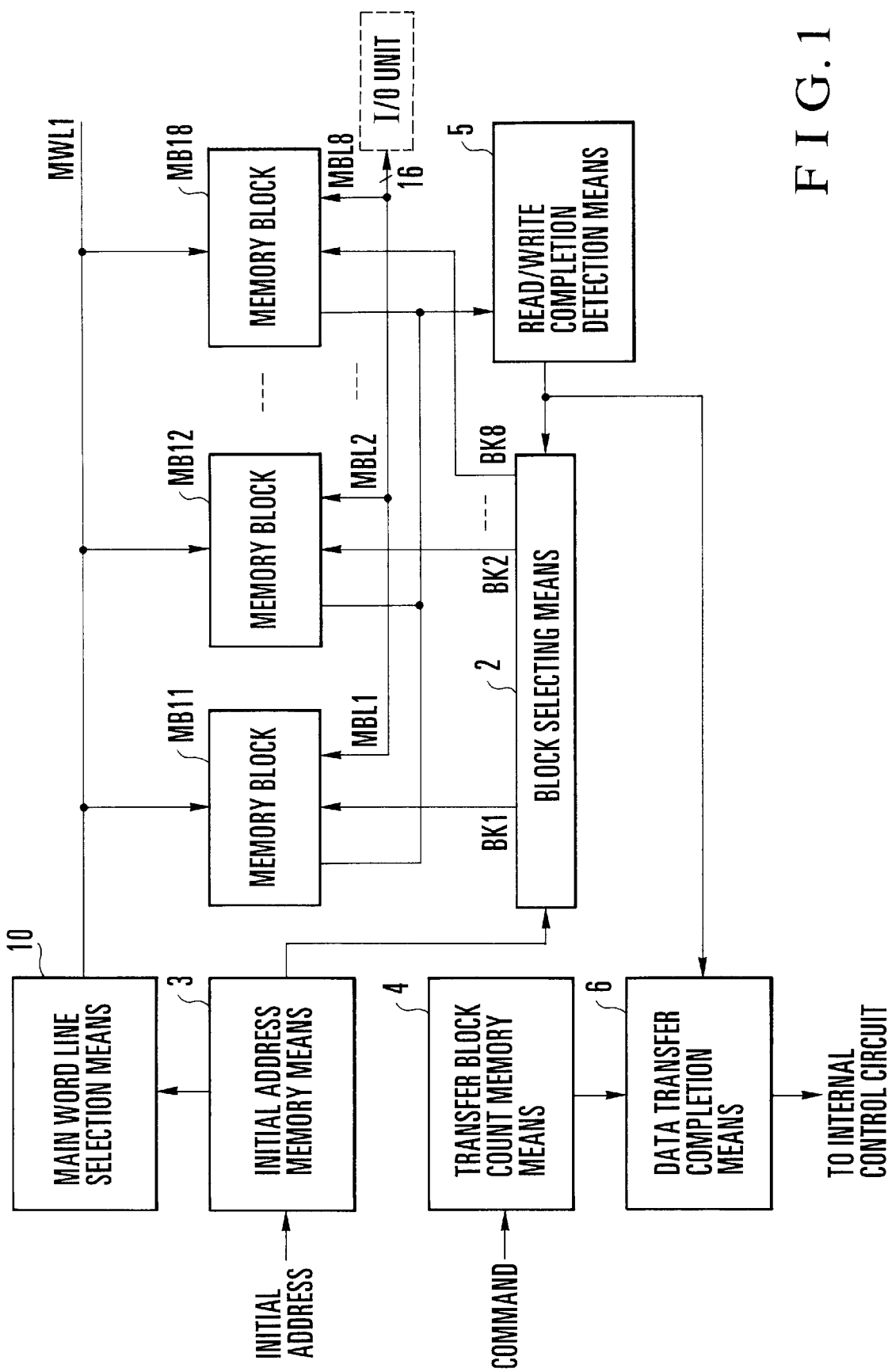
F I G. 1

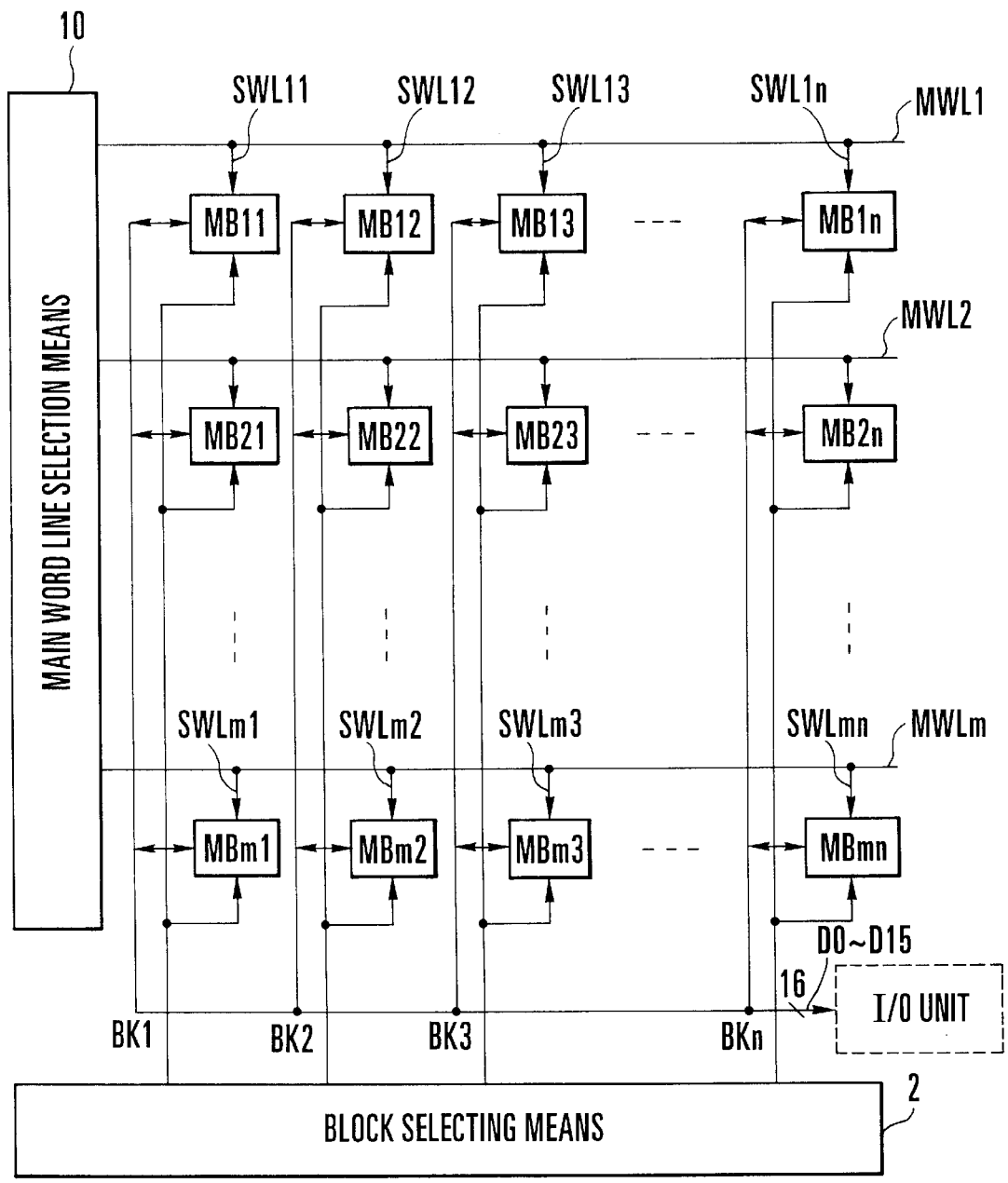
F I G. 5

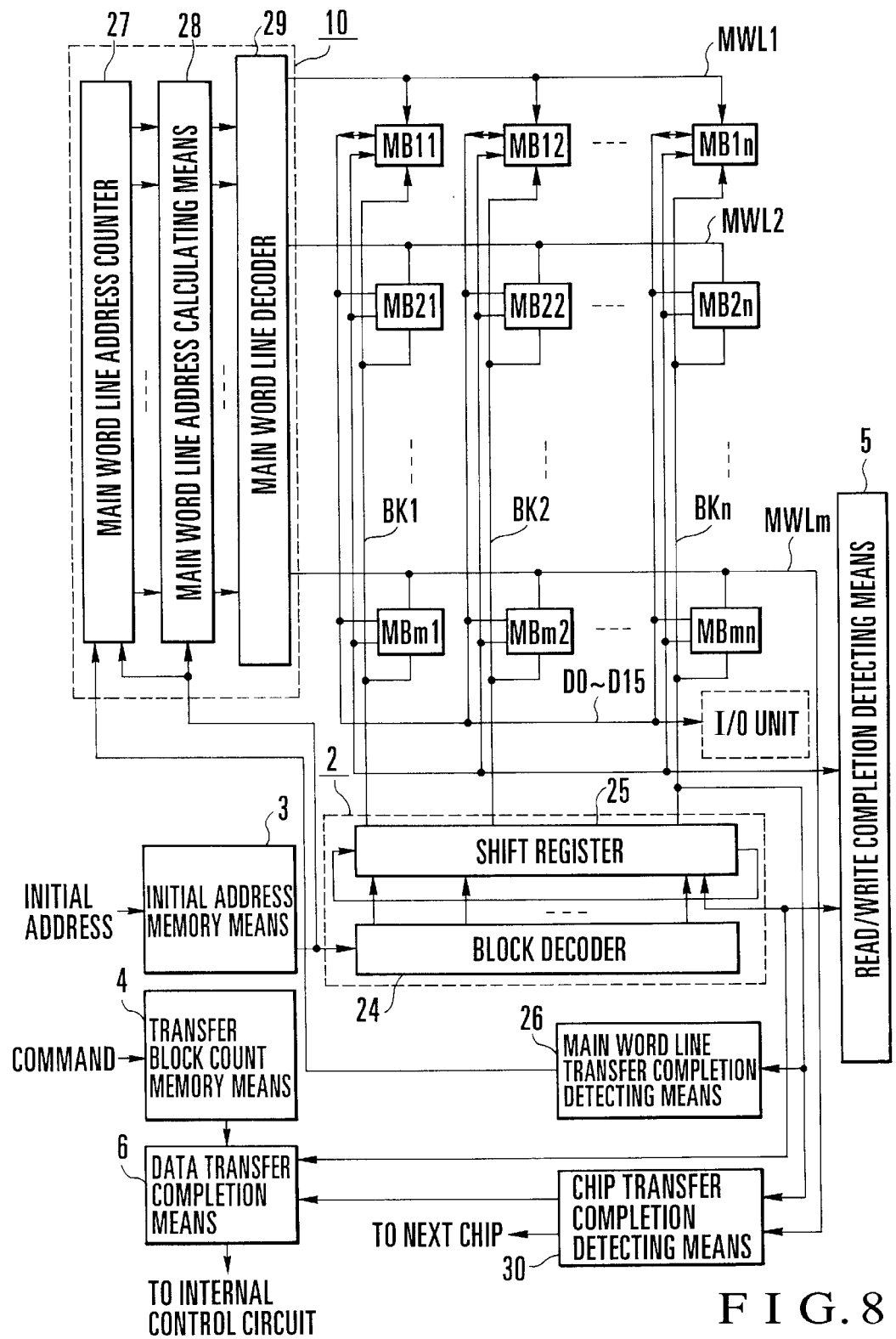
F I G. 8

SEMICONDUCTOR MEMORY DEVICE

BACKGROUND OF THE INVENTION

The present invention relates to a semiconductor memory device for supplying a selection signal to a memory block to read out or write memory information from or in the memory block.

In recent years, various data are communicated via the Internet, and enormous amounts of data including image data and CAD information are transferred. Conventionally, in displaying such data while receiving them by a personal computer, they are temporarily stored in a hard disk and then subjected to necessary display processing because of a large amount of data. However, since the access time to a hard disk is long, necessary processing spends a long time. Recently, with the development of large-capacity semiconductor memory devices, a file memory device using a semiconductor memory device instead of the hard disk is proposed to shorten the processing time.

This file memory need not read out or write (to be referred to as read/write hereinafter) data from or in a memory cell at random, unlike a general semiconductor memory device. The file memory suffices to read/write data from/in memory cells in given successive areas. To achieve this purpose, some file memories can automatically access successive memory areas of a memory main body in a semiconductor memory device and successively read/write data while reducing the number of accesses from the CPU to the memory main body.

FIG. 10 shows the arrangement of a semiconductor memory device disclosed in Japanese Patent Laid-Open No. 7-296579.

In FIG. 10, reference numerals 101a to 101d denote memory cells storing data, which are connected to a word line WL for controlling output of data, and bit lines BL for outputting data. Reference numerals 102a to 102d denote sense amplifiers for amplifying the voltages of the bit lines BL. Data amplified by the sense amplifiers 102a to 102d are respectively input to column selectors 103a to 103d, the outputs of which are connected to an output circuit 104.

Reference numeral 108 denotes a control circuit for controlling a row decoder 105, the sense amplifier 102, and a precharge circuit 110; 109, an output control circuit for controlling the column selector 103; 106, a flag register storing a successive read flag representing the number of data to be successively read out; and 107, a cycle counter for referring to and counting up the value of the flag register in synchronism with clocks.

The operation of the semiconductor memory device shown in FIG. 10 will be explained with reference to timing charts shown in FIGS. 11A to 11F. The case wherein four memory cells are connected to one word line WL and data are successively read/written from/in three of them will be exemplified. FIG. 11A shows an output from a clock generating circuit (not shown).

In an initial state, i.e., the first half of a clock T51, the bit line BL is precharged to "1" by the precharge circuit 110 (FIG. 11C). In this state, the sense amplifiers 102a to 102d are kept inactive, and input/output data from the output circuit 104 is infinite (FIG. 11F).

When an access instruction is generated to successive memory areas of memory cells, a word line WL1 is activated at the trailing edge of the clock T51 in accordance with start address information (FIG. 11B). At this time, a read of successive 3-address data, i.e., "3" is written in the flag register 106 (FIG. 11D), and the cycle counter 107 is cleared to "0" (FIG. 11E).

After the word line WL1 is activated in the second half of the clock T51, memory data are read out onto respective bit lines BL from the memory cells 101a to 101d connected to the activated word line WL1 (FIG. 11C). At the same time, the sense amplifiers 102a to 102d are activated by a sense amplifier activation signal from the control circuit 108 to amplify the data on the bit lines BL and determine the contents of the memory cells on the respective bit lines.

In the second half of the clock T51, the memory cell 101a located at the intersection of the word line WL1 and a bit line BL1 is selected in accordance with start address information. The output of the sense amplifier 102a is connected to the output circuit 104 via the column selector 103a, and data of the memory cell 101a is output outside from the output circuit 104 (FIG. 11F).

With the next clock T52, the value of the cycle counter 107 is updated to "1". In accordance with the updated value and start address information, the column selector 103b is selected by the output control circuit 109. Then, the sense amplifier 102b is connected to the output circuit 104, and data corresponding to the memory cell 101b located at the intersection of the word line WL1 and column address "1" is output (FIG. 11F).

Subsequently, with a clock T53, the value of the cycle counter 107 is updated to "2". In accordance with the updated value and start address information, column address "2" is selected by the output control circuit 109. The sense amplifier 102c is connected to the output circuit 104, and data of the memory cell 101c is output (FIG. 11F).

When the value of the cycle counter 107 reaches "2", the value of the flag register 106 is cleared (FIGS. 11D and 11E). Thereafter, with a clock T54, the activation states of the word line WL1 and each sense amplifier are canceled by the control circuit 108, and the next memory access is prepared.

In this manner, the semiconductor memory device can sequentially successively read/write successive 3-address data by one access from the CPU.

Upon reception of start address information from the outside, the conventional semiconductor memory device sequentially successively accesses memory cells at three successive addresses in a memory cell array and reads out data from these memory cells in accordance with the start address information.

However, recent semiconductor memory devices increase in capacity and can store image data and CAD data in addition to general character codes. Accordingly, many memory cells are connected to one word line or bit line. To read/write data from/in these memory cells at a high speed, many memory cells must be precharged, or many sense amplifiers must always operate. Therefore, a large current flows through a power supply line to generate noise and increase the power consumption.

Upon completion of a read/write for one word line, an address corresponding to the next word line and the number of successive read/write data must be input again from the CPU. For this reason, in transferring a large amount of data, the CPU must frequently interrupt other processing operations and reset memories. This obstructs an increase in data processing speed.

From this viewpoint, a device is proposed in which a large-capacity memory cell array is divided into memory blocks, and data are read/written while respective areas in one divided memory block are successively accessed. Even in this semiconductor memory device, however, the CPU must reset an address and the like in order to read/write data from/in the next block. The CPU must temporarily interrupt other processing operations to access the memory. The processing load of the CPU increases, so the data processing speed of the CPU cannot satisfactorily increase.

SUMMARY OF THE INVENTION

It is an object of the present invention to provide a semiconductor memory device capable of reducing the number of accesses and performing data processing at a high speed in reading/writing data in the semiconductor memory device.

In order to achieve the above object, according to the present invention, there is provided a semiconductor memory device which has a plurality of main word lines, a plurality of sub-word lines connected to the main word lines, and memory blocks connected to the sub-word lines, and can read/write memory information from/in one memory block by supplying a block selection signal to the one memory block, comprising, initial address memory means storing an initial address of a read/write memory block, block count memory means storing the number of read/write memory blocks, read/write completion detecting means for detecting completion of a read/write for one memory block, block selecting means for outputting a block selection signal to activate one memory block on the basis of an initial address, and outputting a block selection signal to activate a next memory block on the basis of a read/write completion detection signal from the read/write completion detecting means, and data transfer completion means for counting the number of read/write completion memory blocks on the basis of the read/write completion detection signal, and when a count value reaches the number of memory blocks in the block count memory means, completing a read/write.

BRIEF DESCRIPTION OF THE DRAWINGS

FIG. 1 is a block diagram showing the arrangement of the main part of a semiconductor memory device according to the first embodiment of the present invention;

FIG. 5 is a block diagram showing the schematic arrangement of the semiconductor memory device;

FIG. 8 is a block diagram showing the arrangement of the main part of a semiconductor memory device according to the second embodiment of the present invention;

DESCRIPTION OF THE PREFERRED EMBODIMENTS

Figure 2:
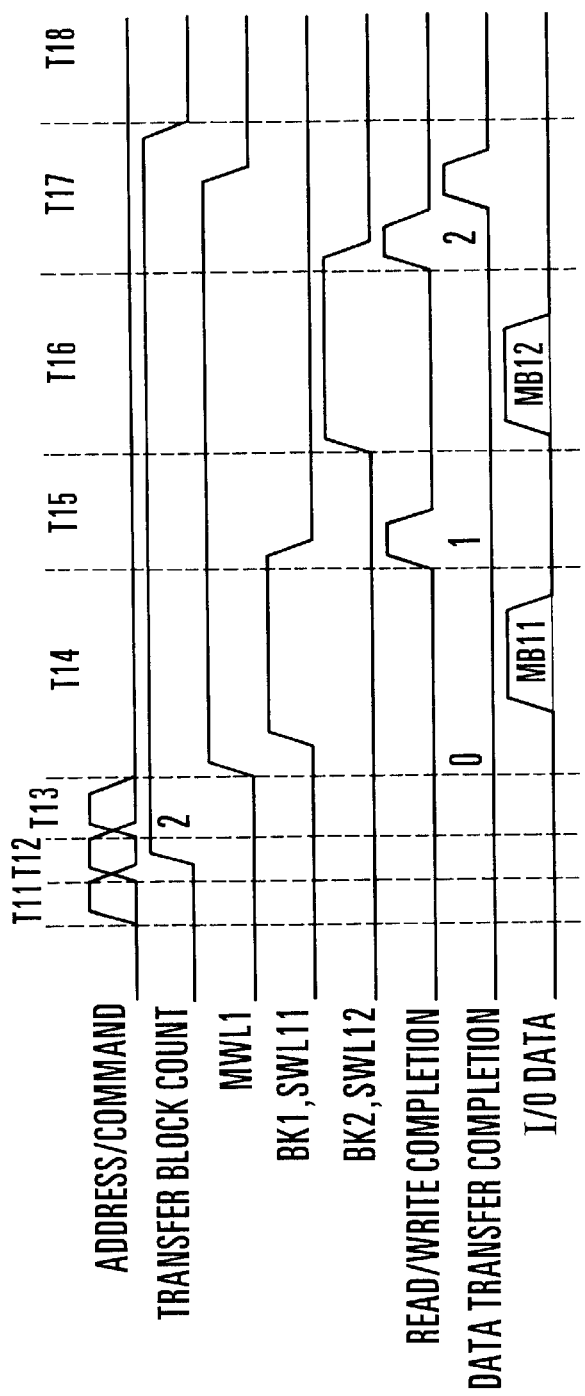
FIGS. 2A to 2H are timing charts showing the operation timing in FIG. 1.

The present invention will be described below with reference to the accompanying drawings.

FIG. 5 shows the schematic arrangement of a semiconductor memory device according to the present invention.

In FIG. 5, reference symbols MB11, MB12, . . . , MBmn denote memory blocks, which are respectively connected to main word lines MWL1 to MWLm via sub-word lines SWL11 to SWLmn. For simplicity, a line branched from a main word line is the sub-word line SWL in FIG. 5. In practice, the sub-word line SWL is connected to the main word line via a sub-word line selecting circuit SWD, as will be described with reference to FIG. 6. Reference numeral 2 denotes a block selecting means for selecting one of block selection signal outputs BK1 to BKn and outputting a signal for selecting a memory block MB. The block selecting means 2 selects one memory block connected to both a selected main word line MWL and a selected block selection line BK, and outputs data stored in the selected memory block to an I/O unit via a data I/O line. In addition, the block selecting means 2 stores data from the I/O unit in a selected memory block. Reference numeral 10 denotes a main word line selecting means for selectively activating one of the main word lines MWL1 to MWLm.

Figure 6:
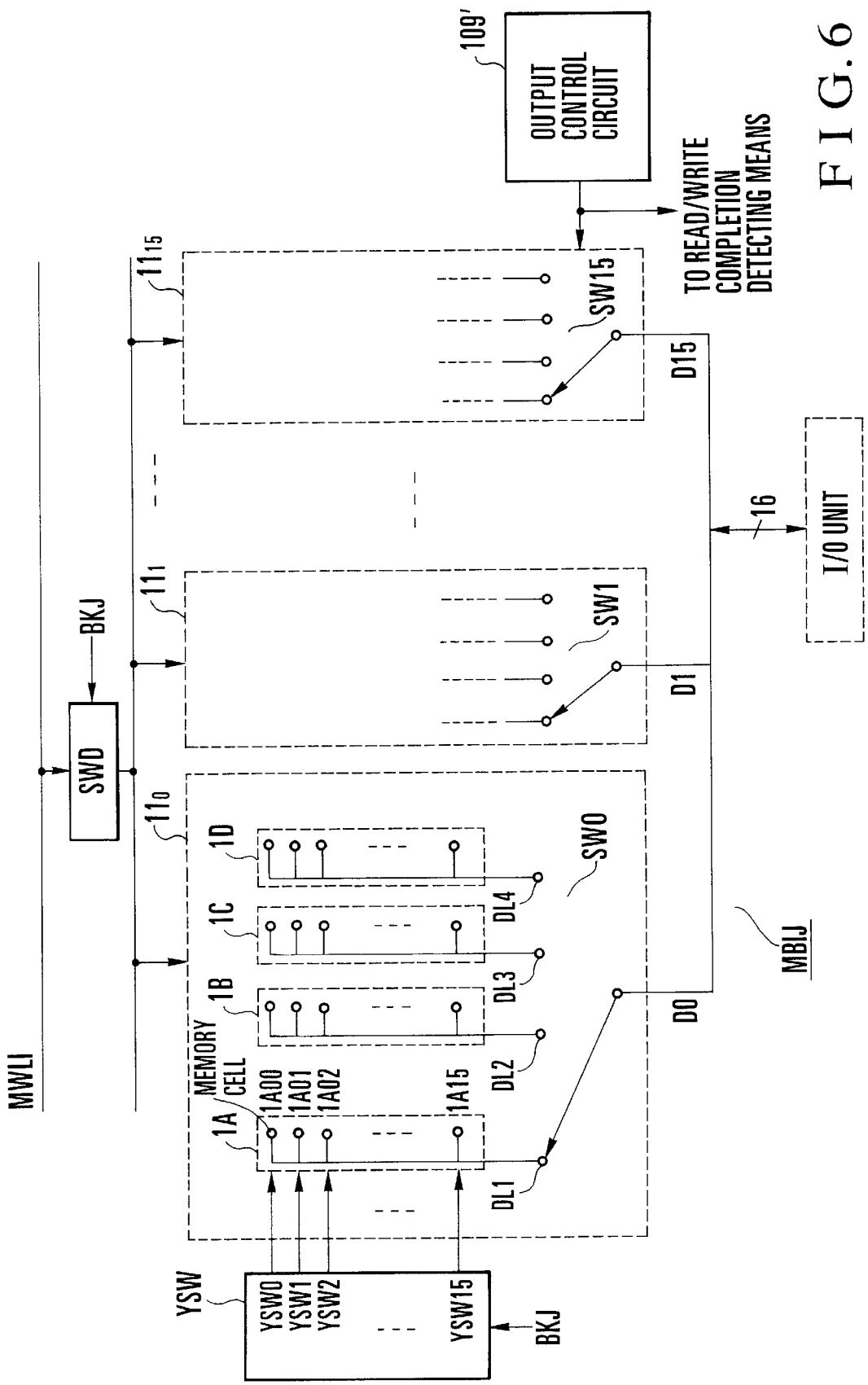
FIG. 6 is a block diagram showing the arrangement of the main part of a memory block in the semiconductor memory device.

FIG. 6 shows a memory block MBij selected by a main word line MWLi in an ith row and a block selection line BKj in a jth column.

The memory block MBij shown in FIG. 6 is constituted by the sub-word line selecting circuit SWD, a sub-word line SWLij selected by this circuit, first unit blocks $11_0$ to $11_{15}$, an output control circuit 109', and a Y switch YSW. Data of the first unit block $11_0$ corresponds to data D0 of 16-bit data input/output to/from the I/O unit. Data of the first unit block $11_1$ corresponds to data D1 of 16-bit data input/output to/from the I/O unit. Data of the first unit block $11_{15}$ corresponds to data D15 of 16-bit data input/output to/from the I/O unit.

The first unit block $11_0$ is made up of second unit blocks 1A, 1B, 1C, and 1D. Sixteen memory cells constituting each of the second unit blocks 1A to 1D are selected by the Y switch YSW, and data are successively read/written via one data line DL. Upon completion of a read of data for one data line, the Y switch YSW is connected to data lines DL1 to DL4. The first unit blocks are sequentially switched by switches SW0 to SW15. As a result, data D0 to D15 of 16 cells×4 (bits) are successively input/output to/from the I/O unit.

Figure 10:
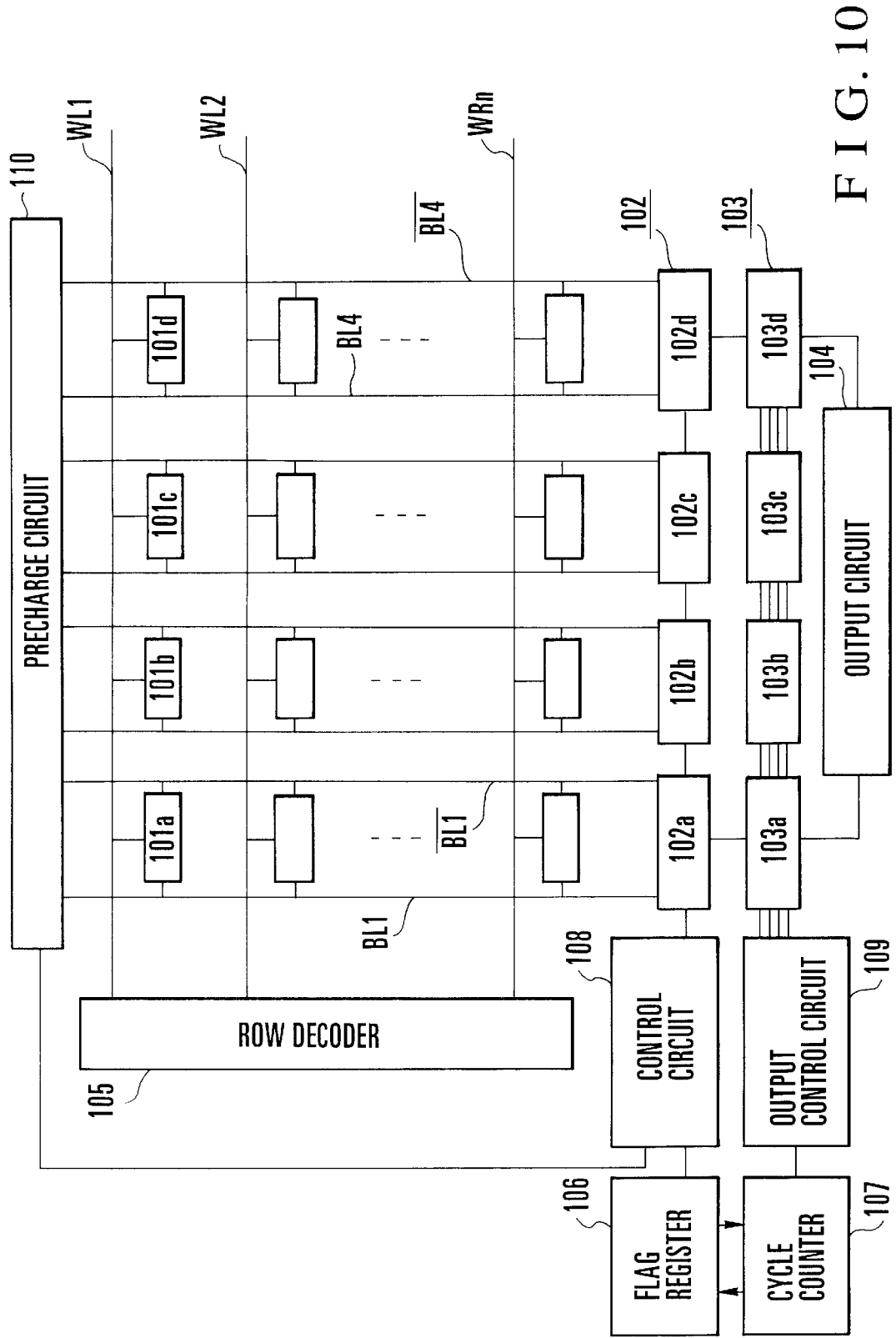
FIG. 10 is a block diagram showing the arrangement of a conventional semiconductor memory device.
Figures 11A, 11B, 11C, 11D, 11E, 11F:
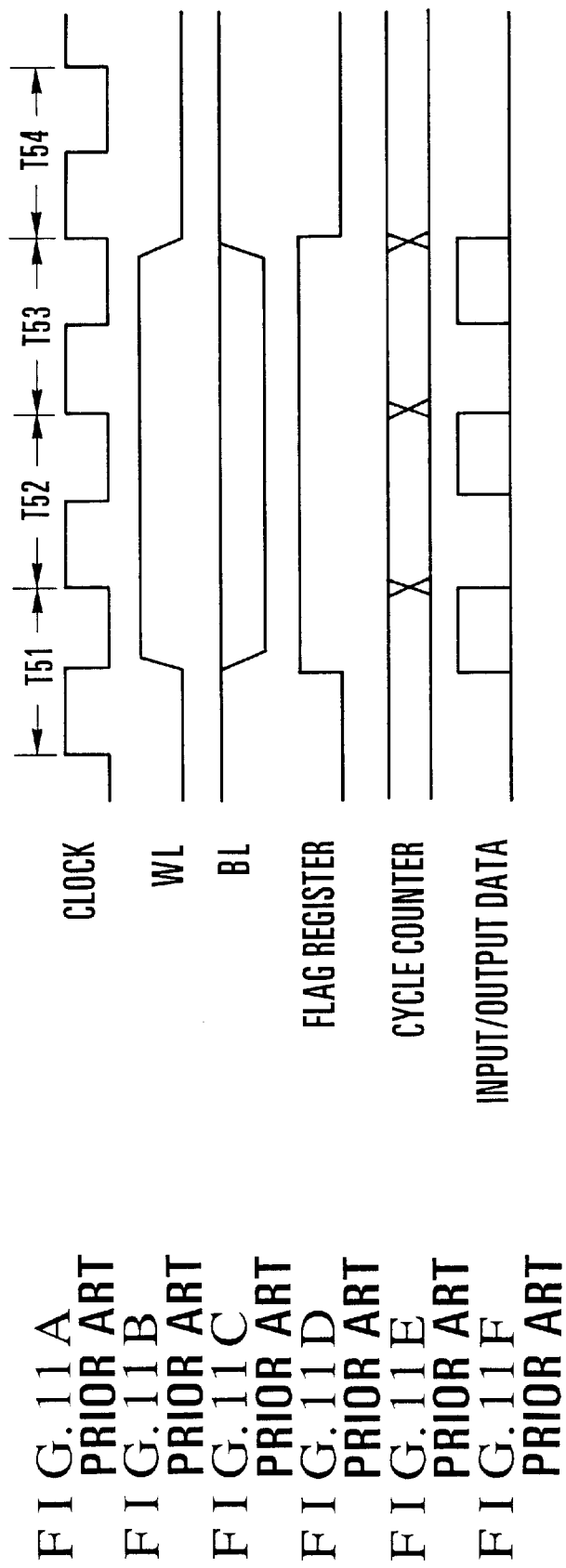
FIGS. 11A to 11F are timing charts showing the operation timings of respective portions in the conventional device.

The switching operation of the switches SW0 to SW15 can be switched by the circuit 109' equivalent to the output control circuit 109 shown in FIG. 10. An output from the output control circuit 109' is also output to a read/write completion detecting means 5.

The connection relationship with the function of the memory block shown in FIG. 6 will be explained below.

The sub-word line selecting circuit SWD receives a main word line selection signal MWLi and a block selection signal BKj. When both lines corresponding to these signals are selected, the sub-word line selecting circuit SWD outputs a selection signal to the sub-word line SWLij. The sub-word line SWLij is connected to the first unit blocks $11_0$ to $11_{15}$. After the sub-word line SWLij is selected, the memory block MBij is activated to allow a read/write.

The first unit blocks $11_0$ to $11_{15}$ are connected to 16 outputs of the Y switch YSW. Upon reception of the block selection signal BKj, the Y switch YSW selects one of the 16 memory cells connected to one of the data lines DL1 to DL4. Upon completion of a read/write for one memory cell, the Y switch YSW successively outputs signals YSW0 to YSW15 for selecting next memory cells, 16×4 times.

One terminal of each of the switches SW0 to SW15 is connected to the four data lines DL1 to DL4. The connection destination of the switch is switched by the output control circuit 109'. The 16 switches SW0 to SW15 are arranged on one memory block. The other terminal of each switch is connected to the 16-byte I/O unit. The output of the output control circuit 109' is also connected to the read/write completion detecting means 5.

The operation of the circuit shown in FIG. 6 will be explained with reference to timing charts in FIGS. 7A to 7J. The case wherein data is read out from the first unit block $11_0$ will be exemplified.

At time T21, when the main word line selection signal MWLi and the block selection signal BKj change to level "H" (FIGS. 7A and 7B), the sub-word line SWLij also changes to level "H" (FIG. 7C) to activate the memory block MBij.

Figure 7:
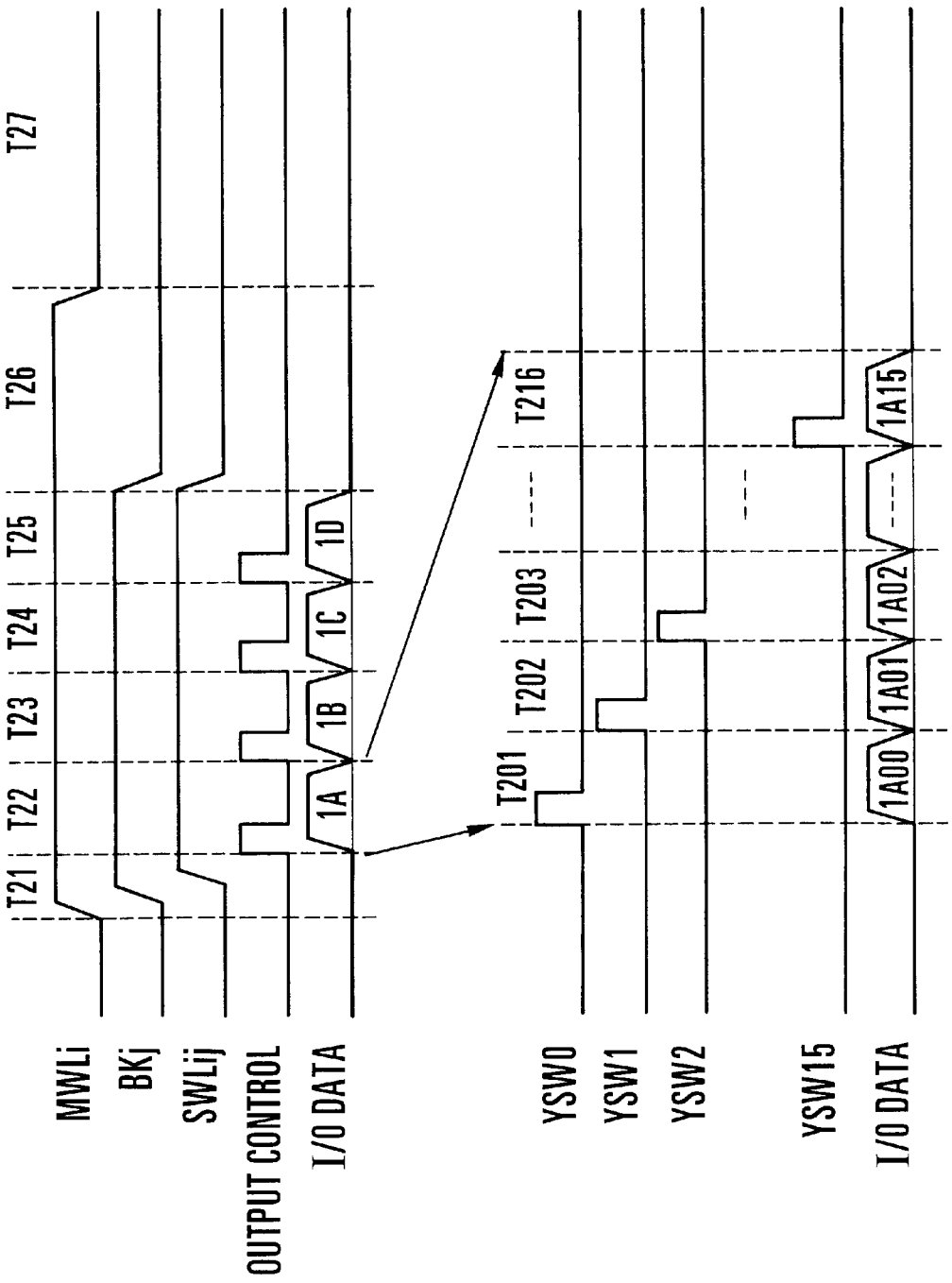
FIGS. 7A to 7J are timing charts showing the operation timings in FIG. 6.

At time T22, when the output control circuit 109' outputs one pulse (FIG. 7D), the switch SW0 is connected to the data line DL1 to start reading out data from the memory cells of the second unit block (1A in FIG. 7E).

FIGS. 7F to 7J show an elongated period at time T22.

At time T201, when the Y switch YSW receives the block selection signal BKj, it changes an output YSW0 to level "H" (FIG. 7F) to select a memory cell 1A00 in the second unit block 1A, amplifies its data by a sense amplifier (not shown), and outputs the amplified data to the I/O unit (1A00 in FIG. 7J). At this time, Y YSW1 to YSW15 except for the Y switch YSW0 are kept at level "L".

At time T202, when the remaining switches except for the Y switch YSW1 change to level "L" while the Y switch YSW1 is kept at level "H" (FIG. 7G), a memory cell 1A01 is selected to output its data (1A01 in FIG. 7J).

During times T203 to T216, the Y switches YSW2 to YSW15 sequentially change to level "H" to output data of memory cells 1A02 to 1A15.

When the Y switch YSW15 changes to level "L", the output control circuit 109' outputs one pulse again at time T23 (FIG. 7D) to switch the switch SW0 to the data line DL2. In this case, data on the data line DL2 are sequentially output similar to times T203 to T216 (1B in FIG. 7E).

At times T24 and T25, similar to T23, data in the second unit blocks 1C and 1D are sequentially read out (1C and 1D in FIG. 7E).

After the output control circuit 109' outputs four pulses (FIG. 7D), the read/write completion detecting means 5 (to be described later) determines completion of a read for one memory block and outputs a read/write completion signal. By this signal, the block selection signal BKj changes to level "L" at time T26 (FIG. 7B). Along with this, the sub-word line SWLij also changes to level "L" (FIG. 7C).

At time T27, when data in a desired number of memory blocks have been transferred, or the main word line MWLi is switched to the next main word line upon completion of a successive read, the main word line MWLi changes to level "L" (FIG. 7A).

In this manner, data of all memory cells in one memory block MBij can be read out by selecting one main word line MWLi and one block selection line BKj to select one sub-word line SWLij, and activating one memory block MBij.

In this embodiment, one second unit memory block has a capacity of 16 bits which correspond to four unit blocks, and therefore each of the first unit memory blocks $11_0$ to $11_{15}$ has a capacity of 64 (=16×4) bits. One memory block comprises 16 first unit memory blocks and thus has a data memory capacity of 1,024 (=64×16) bits. Since 16 bits are equal to 1 byte, one memory block has a capacity of 64 bytes.

Accordingly, when one memory block is selected to read out data, 64-byte data are successively read out from this memory block and transferred to the I/O unit. When data are written in one memory block, 64-byte data are successively transferred from the I/O unit to the memory block.

FIG. 1 shows the schematic arrangement of the semiconductor memory device.

This embodiment exemplifies the case wherein data are read/written from/in a plurality of memory blocks MB11 to MB18 in units of blocks by one access from an external CPU (not shown). In this case, eight memory blocks are connected to one main word line MWL1.

In FIG. 1, the device comprises the above-described block selecting means 2 for transmitting selection signals to the memory blocks MB11, MB12, . . . , MB18, an initial address memory means 3 storing the initial addresses of the memory blocks supplied from the CPU, a transfer block count memory means 4 storing the number of transfer blocks which is supplied as a command from the CPU together with the initial address, i.e., the number of memory blocks subjected to a data read/write, the read/write completion detecting means 5 for detecting completion of a data read/write for the memory block, the main word line selecting means 10 for selecting one of the main word lines MWL on the basis of information of the initial address memory means 3, and a data transfer completion means 6 for detecting completion of a data read/write for all target memory blocks and informing an internal control circuit or the CPU of completion of data transfer.

The connection relationship in FIG. 1 will be described.

An address signal output from the CPU is input to the initial address memory means 3, and its output is input to the block selecting means 2 and the main word line selecting means 10.

One of a plurality of outputs from the main word line selecting means 10 is input to the memory blocks MB11, MB12, . . . , MB18 via the main word line MWL1. The memory blocks MB11, MB12, . . . , MB18 are respectively connected to the sub-word lines SWL11 to SWL18 (not shown) within them. The block selecting means 2 outputs block selection signals BK1 to BK8 to the memory blocks MB11, MB12, . . . , MB18.

The data outputs D0 to D15 of each of the memory blocks MB11, MB12, . . . , MB18 are connected to 16 data output lines of the I/O unit. An output from the output control circuit 109' of each memory block is input to the read/write completion detecting means 5, and its output is input to the block selecting means 2 and the data transfer completion means 6.

A command output from the CPU is input to the transfer block count memory means 4, and its output is input to the data transfer completion means 6.

The operation of the device shown in FIG. 1 will be explained on the basis of timing charts shown in FIGS. 2A to 2H. A case wherein the number of data transfer blocks is "2" and data are successively read out from the memory blocks MB11 and MB12 will be exemplified.

At time T11, a read permission signal (not shown) is input from the CPU to the internal control circuit. At the same time, a command is output via an address line (FIG. 2A). At time T12, the command, i.e., the transfer memory block count "2" is stored in the transfer block count memory means 4 (FIG. 2B).

At times T12 and T13, address data are divisionally output twice from the CPU (FIG. 2A). A read start address is stored as an initial address in the initial address memory means 3. Of the information stored in the initial address memory means 3, upper bits are output to the main word line selecting means 10, whereas lower bits are output to the block selecting means 2.

At time T14, the main word line selecting means 10 selects one main word line MWL1 corresponding to the initial address on the basis of the initial address information, and changes the line MWL1 to level "H" (FIG. 2C). The block selecting means 2 receives the initial address stored in the initial address memory means 3, selects one block selection line BK1 corresponding to the initial address, and changes the line BK1 to level "H" (FIG. 2D). Therefore, the memory block MB11 where both the block selection line BK1 and the main word line MWL1 are at level "H" is selected. Along with this, the sub-word line SWL11 in the memory block MB11 is activated (FIG. 2D). The data stored in memory block MB11 are sequentially output to the data I/O lines D1 to D15 and transmitted to the CPU via the I/O unit (FIG. 2H).

In reading out data of the memory block MB11, an output from the above output control circuit 109' is input to the read/write completion detecting means 5. When the read/write completion detecting means 5 detects that the data line DL is switched four times and that a data read is complete for the memory block MB11, it transmits a read completion signal to the block selecting means 2 and the data transfer completion means 6 at time T15 (FIG. 2F).

At this time, memory blocks except for the selected memory cell are kept inactive, and no current flows therethrough. Even in a large-capacity memory device, therefore, the power consumption can be suppressed very small.

Upon reception of the read completion signal at time T15, the data transfer completion means 6 increments the internal counter from "0" to "1", and compares the value with the number of transfer blocks which is stored in the transfer block count memory means 4. In this case, since the value of the internal counter does not reach the transfer block count "2" stored in the transfer block count memory means 4, the data transfer completion means 6 does not output any data transfer completion signal (FIG. 2G).

On the other hand, upon reception of the read completion signal, the block selecting means 2 changes the block selection line BK1 and the sub-word line SWL11 to level "L" (FIG. 2D). At time T16, the block selecting means 2 changes the next block selection line BK2 and the next sub-word line SWL12 to level "H" (FIG. 2E) to select the memory block MB12. The selected memory block MB12 is activated, and the stored data are sequentially output to the data I/O lines D0 to D15 and transmitted to the CPU via the I/O unit (FIG. 2H).

At time T17, the read/write completion detecting means 5 detects completion of a data read for the memory block MB12, and transmits a read completion signal to the block selecting means 2 and the data transfer completion means 6 at time T15 (FIG. 2F).

Then, the data transfer completion means 6 increments the internal counter from "1" to "2", and compares the value with the number of transfer blocks which is stored in the transfer block count memory means 4. In this case, since the value of the internal counter coincides with the transfer block count "2" stored in the transfer block count memory means 4, the data transfer completion means 6 outputs a data transfer completion signal to the internal control circuit (FIG. 2G). As a result, the main word line MWL1 changes to level "L" (FIG. 2B), and no data is read out from the memory block.

The same control is performed in writing data in the memory blocks MB11 and MB12. More specifically, when data are written in the memory blocks MB11 and MB12, a write permission signal (not shown) is input from the CPU to the internal control circuit. In addition, the write start address of the memory block MB11 is stored as an initial address in the initial address memory means 3. The information stored in the initial address memory means is output to the main word line selecting means 10 and the block selecting means 2. The main word line selecting means 10 selects and activates one main word line MWL corresponding to the initial address on the basis of the initial address information. Assuming the number of data transfer blocks from the CPU is "2", the two memory blocks MB11 and MB12, i.e., the block count "2" is stored in the transfer block count memory means 4.

The block selecting means 2 receives the initial address stored in the initial address memory means 3, selects one block selection line BK corresponding to the initial address, and activates the line BK. In this case, the block selection line BK1 is selected to select the memory block MB11. Then, the selected memory block MB11 is activated, and data input to the data I/O lines D0 to D15 are sequentially written in the memory block MB11 from the I/O unit. A data write for the memory block MB11 is monitored by the read/write completion detecting means 5. When the read/write completion detecting means 5 detects completion of a data write for the memory block MB11, it transmits a write completion signal to the block selecting means 2 and the data transfer completion means 6.

The data transfer completion means 6 increments the internal counter from "0" to "1", and compares the value with the number of transfer blocks stored in the transfer block count memory means 4. In this case, since the value of the internal counter does not reach the transfer block count "2" stored in the transfer block count memory means 4, the data transfer completion means 6 does not output any data transfer completion signal. On the other hand, upon reception of the write completion signal, the block selecting means 2 selects the next memory block MB12. The selected memory block MB12 is activated, and data input to the data I/O lines D0 to D15 are sequentially written in the memory block MB12 from the I/O unit.

When the read/write completion detecting means 5 detects completion of a data write for the memory block MB12, it transmits a write completion signal to the block selecting means 2 and the data transfer completion means 6.

The data transfer completion means 6 increments the internal counter from "1" to "2", and compares the value with the number of transfer blocks which is stored in the transfer block count memory means 4. In this case, since the value of the internal counter coincides with the transfer block count "2" stored in the transfer block count memory means 4, the data transfer completion means 6 outputs a data transfer completion signal to the internal control circuit. As a result, a data write for the memory block stops.

As described above, in this device, even if the memory capacity is very large, data can be successively read/written from/in a plurality of memory blocks. The CPU can read/write data from/in each memory block only by setting an initial address and the number of transfer blocks for the device. Accordingly, the number of accesses to the device decreases to reduce the load of the CPU, and the data processing speed increases.

In addition, since only one memory block MB is activated during a read/write, a smaller circuit current and smaller power consumption can be realized, compared to the conventional arrangement wherein all memories connected to a word line are activated. Since the circuit current is small, noise generated in an internal power supply line can be reduced, and the power supply circuit size and the line width can be reduced. If eight memory blocks are connected to one main word line, as in this embodiment, the power consumed by one main word line can be reduced to ⅛.

Note that in the embodiment shown in FIG. 1, data are successively read/written from/in the two memory blocks MB11 and MB12. For more than two memory blocks, e.g., four or five successive memory blocks, data can be similarly successively read/written by setting the number of transfer blocks to "4" or "5".

By changing the connection between the block selecting means 2 and the memory block MB, distant memory blocks can be sequentially selected, and successive data can be read/written from/in them. In general, while a memory block shifts from an active state to an inactive state and vice versa, the circuit operates unstably, or noise is generated. For this reason, if data are successively read/written from/in adjacent memory blocks, the adjacent blocks may interfere with each other, and a read/write error may occur. By sequentially selecting distant memory blocks, no adjacent blocks interfere with each other, and no read/write error occurs.

Figure 3:
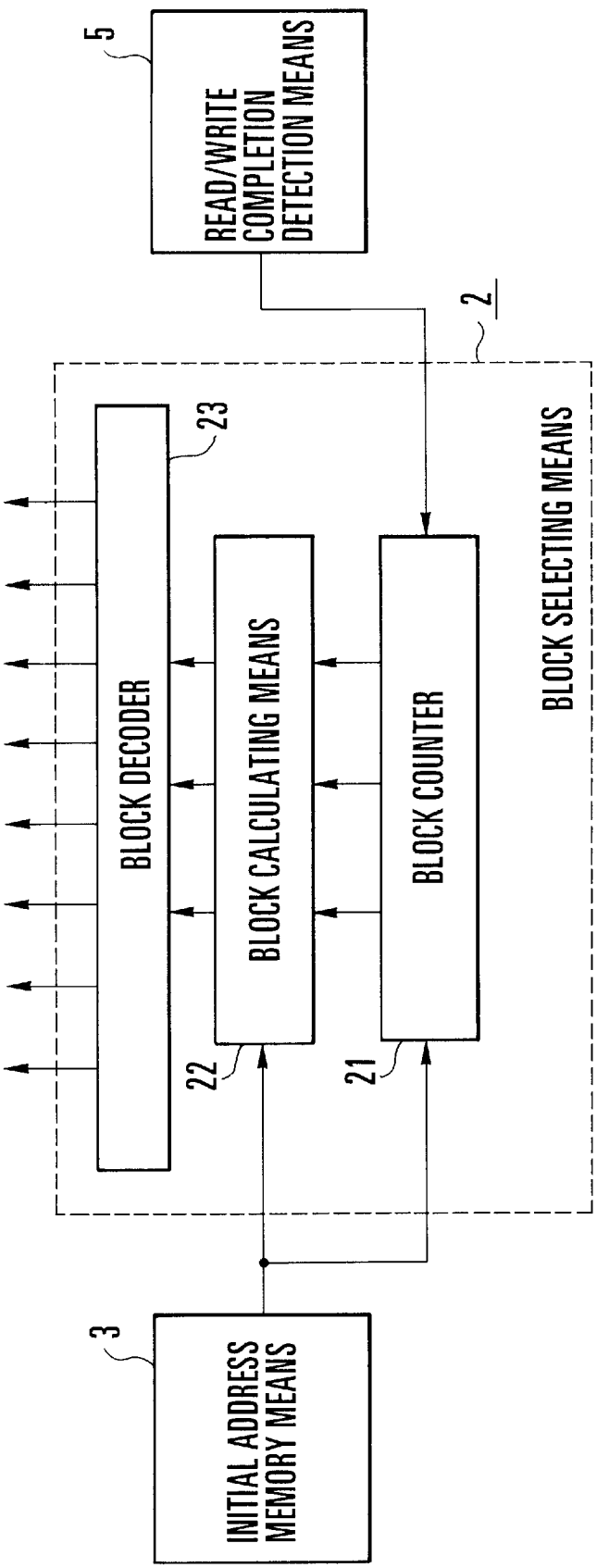
FIG. 3 is a block diagram showing the first arrangement example of a block selecting means constituting the semiconductor memory device.

FIG. 3 shows the first arrangement example of the block selecting means 2.

In FIG. 3, the block selecting means 2 is constituted by a block counter 21, a block calculating means 22, and a block decoder 23.

In reading/writing data from/in a memory block, one of block selection signals BK must be selected.

Of information stored in the initial address memory means 3, a value corresponding to the initial address of the first access memory block is preset in the block calculating means 22. The block counter 21 is set to an initial state.

The block calculating means 22 outputs, to the block decoder 23, an address for selecting the first memory block as a binary code. If eight memory blocks MB are connected to one main word line MWL, the binary code consists of three bits. Upon reception of the address output, the block decoder 23 selects and outputs one of eight block selection signals BK1 to BK8.

If the block calculating means 22 outputs "000", the block decoder 23 selects only the selection signal BK1 to select the first memory block MB1 and start reading/writing data.

Upon completion of a read/write for the first memory block MB1, the read/write completion detecting means 5 outputs a read/write completion signal, and then the block counter 21 increments its value by one. The output from the block counter 21 is added to the initial setting address in the block calculating means 22, which outputs "001" to the block decoder 23. The block decoder 23 outputs "00000010" to select only the selection signal BK2. The next memory block is activated, and data are read/written. After the read/write completion detecting means 5 outputs a read/write completion signal for the memory block, the block counter 21 further counts up its value by one, and outputs the value to the block decoder 23 to make the block decoder 23 output only the selection signal BK3.

In the first arrangement example, the block selecting means 2 is constituted by the block counter 21 for presetting a value corresponding to the initial value of the initial address memory means, and counting up the value every read/write completion signal from the read/write completion detecting means 5, and the block calculating means 22 for adding an output from the block counter 21 to the initial setting address, and a block decoder 23 for receiving an output value from the block calculating means 22, and selecting and outputting one of the eight selection signals BK1 to BK8. One of the eight memory blocks is selected, and data are successively read/written.

In this arrangement, the eight memory blocks are connected to the main word line MWL, and a memory block selected first is the memory block MB1. However, eight or more memory blocks may be connected to the main word line MWL, and a read/write can start from an arbitrary memory block MBn.

In this circuit arrangement, by changing the setting of the block counter 21, the value of the block counter 21 can be discontinuously counted up by, e.g., "+2" or "+3" or down by, e.g., "−1" or "−2" every read/write completion signal from the completion detecting means 5. Therefore, data can be easily read/written from/in distant memory blocks, and no adjacent memory blocks interfere with each other.

The block counter 21 may be cyclically counted. For example, when eight memory blocks are connected to one main word line, and the block counter 21 has a count value "7", the count value is cleared to "0" upon reception of a read/write completion signal from the read/write completion detecting means 5. With this setting, data of the memory blocks of one main word line can be cyclically read/written, or the main word line can be switched to the next one to successively read/write data from/in memory blocks.

Figure 4:
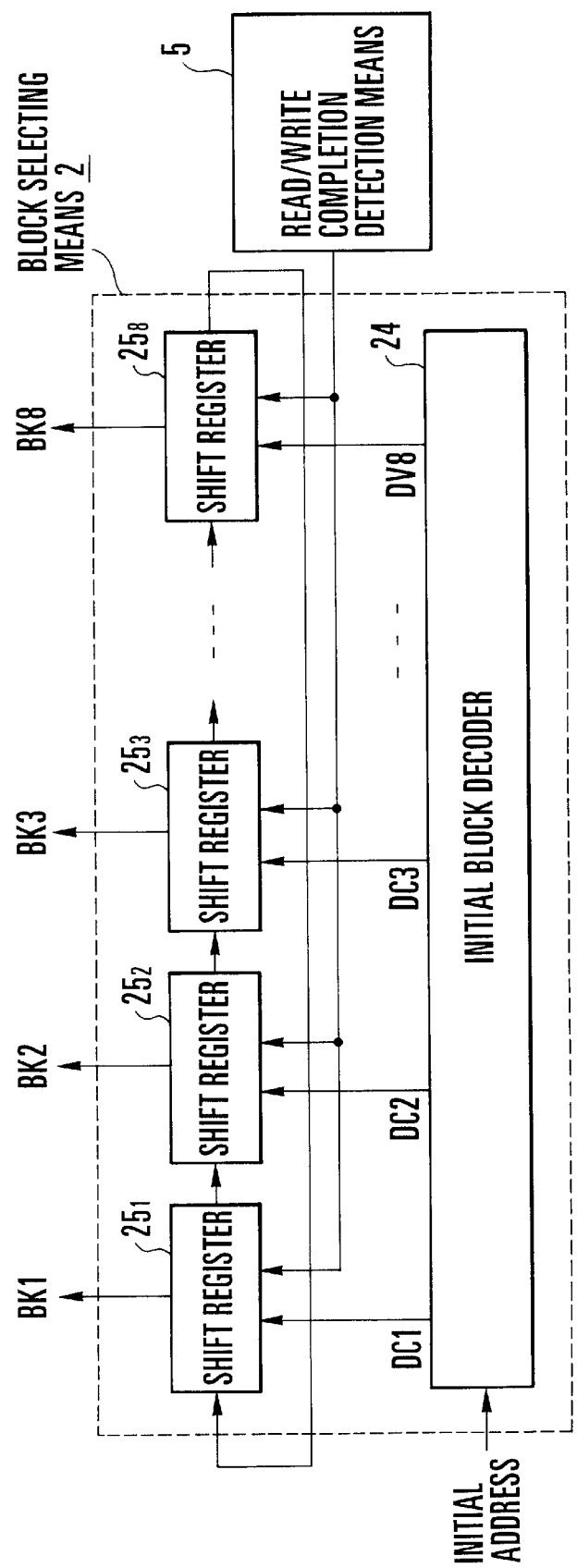
FIG. 4 is a block diagram showing the second arrangement example of the block selecting means.

FIG. 4 shows the second arrangement example of the block selecting means 2.

The block selecting means 2 shown in FIG. 4 is constructed by shift registers $25_1$ to $25_8$, and a block decoder 24 for setting an "H"-level preset value to only one shift register 25 on the basis of a set initial address, while setting the remaining shift registers 25 at level "L".

Assume that the main word line MWL1 is selected, the memory blocks MB11 to MB18 are connected to the main word line MWL1, and the memory blocks MB are sequentially selected from the memory block MB11 to read/write data. In this case, an initial address is set in the initial address memory means 3. A value corresponding to this address is decoded by the block decoder. An "H"-level value is set in only the shift register $25_1$, while an "L"-level value is set in the remaining shift registers $25_2$ to $25_8$. The selection signal BK1 is supplied to only the memory block MB11 first subjected to a data read/write, and only the memory block MB11 where the main word line MWL1 is activated is selected.

When a data read/write is completed for the selected memory block MB11, and the read/write completion detecting means 5 outputs a clock signal representing completion of a read/write, the shift registers $25_1$ to $25_8$ shift the "H"-level output data to the next shift register in synchronism with the clock. As a result, only the shift register $25_2$ changes to level "H", and the block selection signal BK2 is selected to select the memory block MB12. When a data read/write is completed for the selected memory block MB12, and the read/write completion detecting means 5 outputs again a clock signal representing completion of a read/write, the shift registers $25_1$ to $25_8$ shift input data in synchronism with the clock. Then, only the shift register $25_3$ outputs a selection signal to select only the memory block MB13.

In this arrangement, the block selecting means 2 is constituted by the shift registers $25_1$ to $25_8$ and the block decoder 24. A value corresponding to an initial address in the initial address memory means 3 is decoded by the block decoder 24, and the decoded value is preset in the shift register 25. A shift clock is supplied to each of the shift registers $25_1$ to $25_8$ for each read/write completion signal from the read/write completion detecting means 5. With this operation, the respective memory blocks MB are sequentially selected to read/write data. Accordingly, the block selecting means 2 can be realized with a simple arrangement.

By connecting the output of the shift register $25_8$ to the shift register $25_1$, a circulating shift register can be obtained. When a read/write is complete for the memory block MB18 connected to the block selection line BK, data can be read/written from/in the memory block MB11 or the memory block MB21 connected to the next main word line.

If the outputs of the shift registers $25_1$ to $25_8$, i.e., the block selection signals BK1 to BK8 are connected to memory blocks spaced apart from each other, data can be read/written from/in the distant memory blocks, and no adjacent memory blocks interfere with each other. For example, if the memory blocks are sequentially successively arranged in the order of MBi1, MBi2, . . . , MBi8, they are connected to respective memory blocks such that BK1-MBi1, BK2-MBi5, BK3-MBi2, BK4-MBi6, BK5-MBi3, BK6-MBi7, BK7-MBi4, and BK8-MBi8.

FIG. 8 shows the second embodiment.

In the second embodiment, data can be successively read/written from/in memory blocks MB of different main word lines MWL by adding a main word line transfer completion detecting means 26, and a main word line address counter 27 and a main word line address calculating means 28 to a main word line selecting means 10. Further, data can be successively read/written from/in different chips by arranging a chip transfer completion detecting means 30.

The connection and function of each block will be explained with reference to FIG. 8.

An initial address for starting a read/write, and a command representing the number of read/write memory blocks are output from the CPU or the like to an initial address memory means 3 and a transfer block count memory means 4.

Of the address data stored in the initial address memory means 3, lower-bit data is output to a block selecting means 2, and upper-bit data is output to the main word line selecting means 10. By this output, the main word line address counter 27 in the main word line selecting means 10 is reset. At the same time, the initial address data is set in the main word line address calculating means 28. The value set in the main word line address calculating means 28 by an output from the main word line address counter 27 is input to a main word line decoder 29. On the basis of the value, the main word line decoder 29 selects only one main word line MWLx from a plurality of main word lines MWL1 to MWLm, and outputs a selection signal. Note that reference symbol x denotes one integer from 1 to m.

The lower-bit data of the initial address is input to a block decoder 24 in the block selecting means 2. The block decoder 24 decodes the lower-bit data, and sets the decoded value in a shift register group 25. The shift register group 25 outputs a block selection signal BKy for selecting one of n memory block columns. Note that reference symbol y denotes one integer from 1 to n.

As a result, only a memory block MBxy receiving both the selected main word line selection signal MWLx and the selected block selection signal BKy is selected to read/write data. Data are successively read/written from/in the selected memory block MBxy by switching a signal from an output control circuit 109' and a switch YSW, as shown in FIG. 6. The data read out from the memory block MBxy are transferred to an I/O unit, whereas write data are transferred to the memory block MBxy from the I/O unit.

An output control signal output from the selected memory block MBxy is input to a read/write completion detecting means 5, which counts the number of times of switching of a data line DL. An output from the read/write completion detecting means 5 is input to the block selecting means 2 and the data transfer completion means 6. The data transfer completion means 6 counts the number of transfer completion memory blocks MB and determines whether this number coincides with the number of transfer blocks which is set by the command. If the number of memory blocks MB is smaller than the set number of transfer blocks, data are successively read/written from/in memory blocks. Otherwise, the internal control circuits such as the block selecting means 2 and the main word line selecting means 10 is reset. If the number of transfer completion blocks is smaller than the set number of transfer blocks, the block selecting means 2 outputs a block selection signal for the next read/write memory block MB.

A block selection signal BKn is supplied to memory blocks on the nth column and to the main word line transfer completion detecting means 26. The main word line transfer completion detecting means 26 detects completion of a read/write for the last read/write block MBxn of one main word line MWLx. An output from the main word line transfer completion detecting means 26 is input to the main word line address counter 27 in the main word line selecting means 10. Upon reception of the completion signal from the main word line transfer completion detecting means 26, the main word line address counter 27 increments the count value by one, and outputs the sum with data stored in a main word line address buffer to the main word line decoder 29.

Further, a signal for the mth main word line MWLm and the nth block selection signal BKn are input to the chip transfer completion detecting means 30, which detects completion of a read/write for successive memory blocks in one chip, and inputs a detection signal to a data transfer completion means 6. At the same time, the chip transfer completion detecting means 30 informs the next read/write chip of completion of transfer of the own chip, thereby starting a successive read/write for the next chip. Alternatively, the chip transfer completion detecting means 30 outputs an interrupt signal to the CPU or the like to start necessary processing.

FIGS. 9A to 9L show timing charts in FIG. 8.

The operation in FIG. 8 will be explained with reference to FIGS. 9A to 9L. For descriptive convenience, m=5 and n=8 in FIG. 8. More specifically, eight memory blocks MBy1 to MBy8 are connected to one main word line MWLy, and five main word line MWL1 to MWL5 and eight block selection lines BK1 to BK8 are arranged. A transfer start memory block is MB27, and memory data are successively read out from four memory blocks starting from the memory block MB27.

Figure 9:
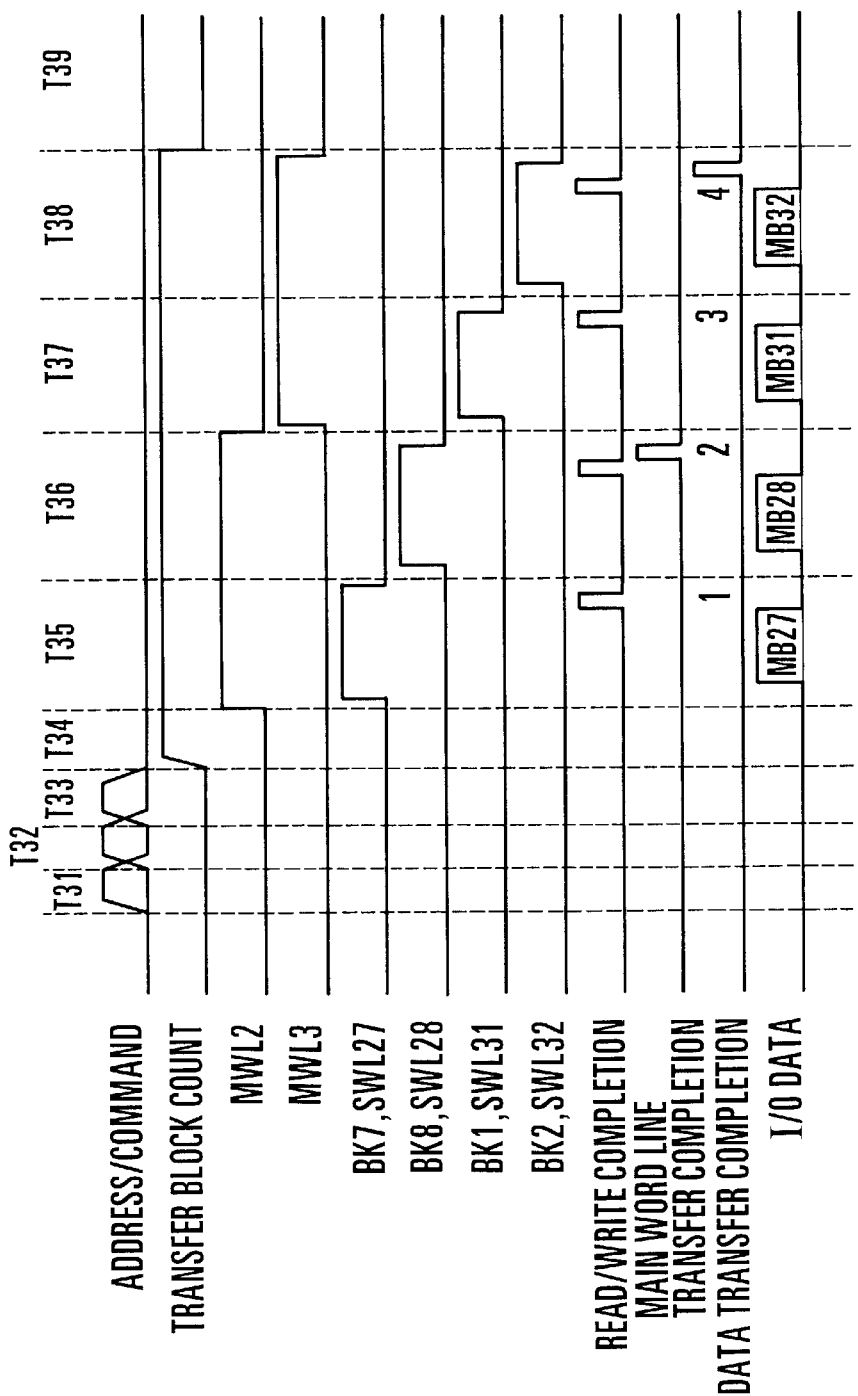
FIGS. 9A to 9L are timing charts showing the operation timings in FIG. 8.

During times T31 to T33, a command representing an initial address for starting a read/write and the number of read/write memory blocks is output from the CPU or the like to the initial address memory means 3 and the transfer block count memory means 4 via an address line (not shown) (FIG. 9A).

A In this example, the command also represents an address. However, another command can also be input to the transfer block count memory means 4 via the I/O unit. The command and the address are divisionally input three times, but the number of input operations can be properly changed to two or four in accordance with the number of address lines.

At time T34, a transfer block count "4"0 is set in the transfer block count memory means 4 on the basis of the input command (FIG. 9B).

At time T35, of the address data stored in the initial address memory means 3, lower-bit data is output to a block selecting means 2, and upper-bit data is output to the main word line selecting means 10. By this output, the main word line address counter 27 in the main word line selecting means 10 is reset. At the same time, the initial address data is set in the main word line address calculating means 28. The value set in the main word line address calculating means 28 by an output from the main word line address counter 27 is input to the main word line decoder 29. On the basis of the value, the main word line decoder 29 selects only one main word line MWL2 from a plurality of main word lines MWL1 to MWL8, and outputs an "H"-level signal (FIG. 9C).

The lower-bit data of the initial address is input to the block decoder 24 in the block selecting means 2. The block decoder 24 decodes the lower-bit data, and sets the decoded value in the shift register group 25. The shift register group 25 outputs a block selection signal BK7 for selecting memory blocks on the seventh column from memory blocks on the eight columns (FIG. 9E).

As a result, only the memory block MB27 receiving both the selected main word line selection signal MWL2 and the selected block selection signal BK7 is selected to start reading data. The selected memory block MB27 successively outputs data by a signal from the output control circuit 109' and switching of the switch YSW, as shown in FIG. 6. The data are transferred from the I/O unit to the outside such as the CPU (MB27 in FIG. 9L). At this time, only a sub-word line SWL27 in the memory block MB27 is selected (FIG. 9E), while remaining sub-word lines SWL in the same chip are not selected.

In the conventional semiconductor memory device, a current flows through all memory cells connected to a word line. To the contrary, in the second embodiment, a current flows through only the memory block MB27 of the eight memory blocks connected to the main word line. Therefore, the power consumption can be reduced to ⅛. Along with this, a current flowing through a power supply line connected to a main word line or a memory block reduces to ⅛, so that noise and a noise error can be reduced.

The read/write completion detecting means 5 counts the number of output control signals from the selected memory block MB27, i.e., the number of switching signals for the data line DL. In the example of FIG. 6, four output controls signals, i.e., four switching signals are output. Therefore, when the read/write completion detecting means 5 counts four signals, it detects completion of data transfer for one memory block MB27, and outputs one pulse (FIG. 9I).

The transfer block count memory means 4 counts the number of pulses, and sets it to "1". The transfer block count memory means 4 compares the value "1" with the transfer block count "4" stored therein, determines that the value does not reach "4", and thus continues transfer processing (FIG. 9K).

One pulse output from the read/write completion detecting means 5 is input to the shift register group 25 to shift the signal set therein by one. At time T36, the block selection line BK8 and the sub-word line SWL28 change to level "H", while the remaining signals and lines are kept at level "L" (FIG. 9F).

At time T36, similar to time T35, data of the memory block MB28 are transferred to the I/O unit (MB28 in FIG. 9L). When the read/write completion detecting means 5 detects completion of data transfer for the memory block MB28, it outputs a read/write completion pulse (FIG. 9I). Then, the block selection line BK8 and the sub-word line SWL8 change to level "L" (FIG. 9E).

The block selection signal BK8 is input to the main word line transfer completion detecting means 26. Upon detecting the trailing edge of the block selection signal BK8, the main word line transfer completion detecting means 26 determines completion of transfer for all the memory blocks connected to one main word line, and outputs a main word line transfer completion pulse (FIG. 9J).

By this pulse, the main word line address counter 27 increments the counter by one, and outputs the sum with data stored in the main word line address calculating means 28 to the main word line decoder 29.

At time T37, the main word line decoder 29 changes the main word line MWL3 to level "H" based on the output (FIG. 9D), while keeping the remaining main word lines at level "L" (FIG. 9C). In addition, the block selection signal BK1 and the sub-word line SWL31 change to level "H" (FIG. 9G).

At times T37 and T38, data of the memory blocks MB31 and MB32 are similarly successively output to the I/O unit (FIG. 9L).

At time T38, upon completion of a data read from the memory block MB32, a read/write completion pulse is output (FIG. 9I), and both the block selection signal BK2 and the sub-word line SWL32 change to level "L" (FIG. 9H).

This read/write completion pulse is input to the data transfer completion means 6 to increment the counter therein by one. If the counter value reaches "4" and coincides with the value "4" set in the transfer block count memory means 4, the data transfer completion means 6 outputs a data transfer completion pulse (FIG. 9K). After the pulse is output, the internal control circuits such as the block selecting means 2, the main word line selecting means 10, and the transfer block count memory means 4 are reset, and their outputs change to level "L" (FIGS. 9B and 9D).

Although not shown in FIGS. 9A to 9L, when the last read memory block MB58 in one chip is selected, the main word line selection signal MWL5 and the block selection line BK8 are also input to the chip transfer completion detecting means 30. Upon completion of a read for the memory block MB58, the chip transfer completion detecting means 30 detects the trailing edges of both the main word line selection signal MWL5 and the block selection line BK8, and then outputs a chip transfer completion pulse. By this pulse, the chip transfer completion detecting means 30 informs the next read/write chip of completion of its own chip, thereby starting a successive read/write for the next chip. Alternatively, the chip transfer completion detecting means 30 outputs an interrupt signal to the CPU or the like to start necessary processing.

Although the above description concerns a read, a write is similarly successively performed.

As described above, only by setting an initial address and the number of transfer blocks by the CPU, data stored in the memory block MB can be successively transferred. For this reason, the number of interrupt requests from the memory to the CPU decreases, the CPU can involve in other processing operations, and the processing speed of the data processing device increases.

In addition, since only one memory block MB is activated during a read/write, a smaller circuit current and smaller power consumption can be realized, compared to the conventional arrangement wherein all memories or sense amplifiers connected to a selected word line are activated. Since the circuit current is small, noise generated in an internal power supply line can be reduced, and the power supply circuit size and the line width can be reduced.

As has been described above, according to the present invention, the initial address of a read/write memory block, and the number of read/write memory blocks are stored. The block selecting means activates one memory block based on the initial address, and upon detecting completion of a read/write for one memory block, activates the next memory block. The completion means completes a read/write when the number of memory blocks counted based on a read/write detection signal reaches the number of blocks which is stored in advance. Only by setting an initial address and the number of transfer blocks in the device, data can be successively read/written from/in a plurality of memory blocks. Therefore, the number of accesses to this device decreases, and the data processing speed increases.

The block selecting means is constituted by the counter means whose value is counted by an output from the read/write completion detecting means, the means for presetting an output from the initial address memory means in the counter means, and the means for decoding an output from the counter means and outputting block selection signal. A memory block can be selected with a simple arrangement.

Further, the block selecting means is constituted by the shift register circuits whose values are shifted by an output from the read/write completion detecting means, and the means for presetting a shift register circuit at a position corresponding to the initial address memory means at the start of a successive read/write. Similarly, a memory block can be selected with a simple arrangement.

What is claimed is:

1. A semiconductor memory device which has a plurality of main word lines, a plurality of sub-word lines connected to said main word lines, and memory blocks connected to said sub-word lines, and can read/write memory information from/in one memory block by supplying a block selection signal to said one memory block, comprising:

initial address memory means storing an initial address of a read/write memory block;

block count memory means storing the number of read/write memory blocks;

read/write completion detecting means for detecting completion of a read/write for one memory block;

block selecting means for outputting a block selection signal to activate one memory block on the basis of an initial address, and outputting a block selection signal to activate a next memory block on the basis of a read/write completion detection signal from said read/write completion detecting means; and data transfer completion means for counting the number of read/write completion memory blocks on the basis of the read/write completion detection signal, and when a count value reaches the number of memory blocks in said block count memory means, completing a read/write.

2. A device according to claim 1, wherein said block selecting means comprises:

a block counter for incrementing/decrementing the count value by an output from said read/write completion detecting means;

block calculating means for presetting an output from said initial address memory means, and adding or subtracting an output from said block counter to or from the preset value; and a block decoder for decoding an output from said block calculating means and outputting the block selection signal.

3. A device according to claim 2, wherein said block counter cyclically counts the number of memory blocks connected to one main word line.

4. A device according to claim 1, wherein said block selecting means comprises:

shift register circuits which are shifted by an output from said read/write completion detecting means; and means for presetting a shift register circuit at a position corresponding to a memory content of said initial address memory means at a start of a successive read/write.

5. A device according to claim 4, wherein said shift register circuits include registers equal in number to memory blocks connected to one main word line, and an output of a last register is connected to an input of a first register.

6. A device according to claim 2, wherein said block counter sequentially selects distant memory blocks by adding or subtracting a number of not less than 2 in reception of an output from said read/write completion detecting means.

7. A device according to claim 1, further comprising:

main word line transfer completion detecting means for detecting completion of a read/write for a last memory block of a plurality of memory blocks connected to one main word line; and main word line selecting means for calculating a next main word line to be selected on the basis of an output from said main word line transfer completion detecting means, and outputting a selection signal.

8. A device according to claim 7, wherein said main word line selecting means comprises:

a main word line address counter for incrementing/decrementing a count value by an output from said main word line transfer completion detecting means;

main word line address calculating means for presetting an output from said initial address memory means, and adding or subtracting an output from said main word line address counter to or from the present value; and a main word line decoder for decoding an output from said main word line address calculating means and outputting a main word line selection signal.

9. A device according to claim 7, further comprising:

chip transfer completion detecting means for detecting completion of a read/write of a last memory block of a plurality of memory blocks connected to one main word line, and detecting completion of a read/write of a last main word line of said plurality of main word lines.

10. A device according to claim 1, wherein said memory blocks connected to be successively selected by said block selecting means are arranged distant from each other, thereby sequentially selecting said distant memory blocks.

* * * * *